United States Patent
Tsuji et al.

(10) Patent No.: US 9,753,172 B2
(45) Date of Patent: Sep. 5, 2017

(54) OPERATION DETECTING APPARATUS FOR VEHICLE

(71) Applicant: AISIN SEIKI KABUSHIKI KAISHA, Kariya-shi (JP)

(72) Inventors: Haruki Tsuji, Anjo (JP); Hitoshi Takayanagi, Kariya (JP); Takaya Aiyama, Anjo (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 7 days.

(21) Appl. No.: 14/945,834

(22) Filed: Nov. 19, 2015

(65) Prior Publication Data
US 2016/0139285 A1 May 19, 2016

(30) Foreign Application Priority Data
Nov. 19, 2014 (JP) .................................. 2014-234149

(51) Int. Cl.
*G06F 3/01* (2006.01)
*G01V 3/08* (2006.01)
(Continued)

(52) U.S. Cl.
CPC ................. *G01V 3/08* (2013.01); *B60R 16/02* (2013.01); *H03K 17/955* (2013.01);
(Continued)

(58) Field of Classification Search
CPC ............ G01R 27/2605; G01R 27/2611; G01R 27/2617; G01R 29/0892; G01R 31/02;
(Continued)

(56) References Cited

U.S. PATENT DOCUMENTS

| | | | |
|---|---|---|---|
| 7,205,777 B2 | 4/2007 | Schulz et al. | |
| 2005/0024065 A1* | 2/2005 | Umeda | G06K 9/0002 |
| | | | 324/663 |

(Continued)

FOREIGN PATENT DOCUMENTS

| | | | |
|---|---|---|---|
| DE | 10 2007 048 402 A1 | 4/2009 | |
| DE | 102007048402 A1 * | 4/2009 | ............. G06F 3/044 |

(Continued)

OTHER PUBLICATIONS

U.S. Appl. No. 14/945,821, filed Nov. 19, 2015, Hirota, et al.
(Continued)

*Primary Examiner* — Patrick Assouad
*Assistant Examiner* — Taqi Nasir
(74) *Attorney, Agent, or Firm* — Oblon, McClelland, Maier & Neustadt, L.L.P.

(57) ABSTRACT

An operation detecting apparatus for a vehicle includes: a detecting unit including a first electrode and a second electrode for detecting variations in capacitance value; a capacitance measuring unit configured to measure a first capacitance value detected by the first electrode and a second capacitance value detected by the second electrode; a determining unit configured to compare a value on the basis of an amount of variations in the first capacitance value with a value on the basis of an amount of variations in the second capacitance value and determine presence or absence of operation from a user on the basis of the result of comparison; and an output unit configured to output a control signal on the basis of a result of determination of the determining unit.

6 Claims, 12 Drawing Sheets

(51) Int. Cl.
*B60R 16/02* (2006.01)
*H03K 17/955* (2006.01)

(52) U.S. Cl.
CPC .............. *H03K 2217/96073* (2013.01); *H03K 2217/960705* (2013.01); *H03K 2217/960745* (2013.01); *H03K 2217/960775* (2013.01)

(58) Field of Classification Search
CPC G01R 31/2884; G01R 31/312; G01R 31/362; G01R 31/3658; G01R 31/40; G01R 35/00; G01R 35/005
USPC ....... 324/347, 358, 359, 370, 444–449, 515, 324/530, 559, 519, 658–690; 345/173–178
See application file for complete search history.

(56) References Cited

U.S. PATENT DOCUMENTS

| | | | | |
|---|---|---|---|---|
| 2010/0231238 A1* | 9/2010 | Toyota | ................. | G01D 5/2405 324/662 |
| 2012/0123985 A1 | 5/2012 | Kwon et al. | | |
| 2013/0321002 A1* | 12/2013 | Elliott | ................. | G01D 11/245 324/662 |
| 2014/0176160 A1* | 6/2014 | Erkens | ................. | H03K 17/955 324/658 |
| 2014/0303926 A1* | 10/2014 | Sessego | ................. | G01L 25/00 702/104 |
| 2014/0352400 A1* | 12/2014 | Barrilado | ................. | B81B 7/008 73/1.38 |
| 2015/0002445 A1* | 1/2015 | Brunet | ................. | G06F 3/0418 345/174 |
| 2015/0177298 A1 | 6/2015 | Sugiura | | |

FOREIGN PATENT DOCUMENTS

| | | |
|---|---|---|
| EP | 1 450 489 B1 | 1/2010 |
| EP | 2 228 905 A1 | 9/2010 |
| EP | 2 474 842 A1 | 7/2012 |
| JP | 2006-213206 | 8/2006 |

OTHER PUBLICATIONS

U.S. Appl. No. 14/945,997, filed Nov. 19, 2015, Hirota, et al.
Extended European Search Report issued Apr. 13, 2016 in Patent Application No. 15195155.5.

* cited by examiner

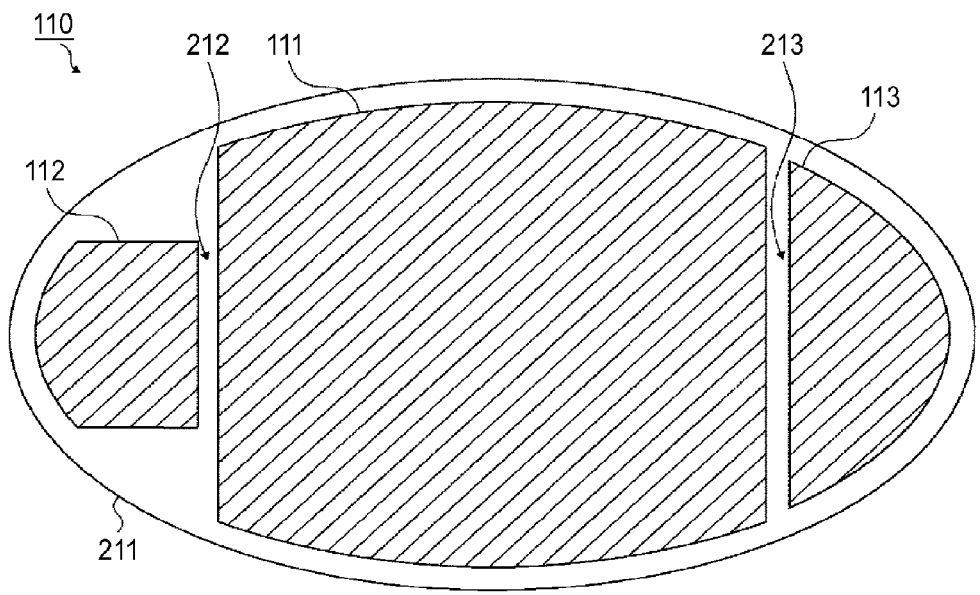
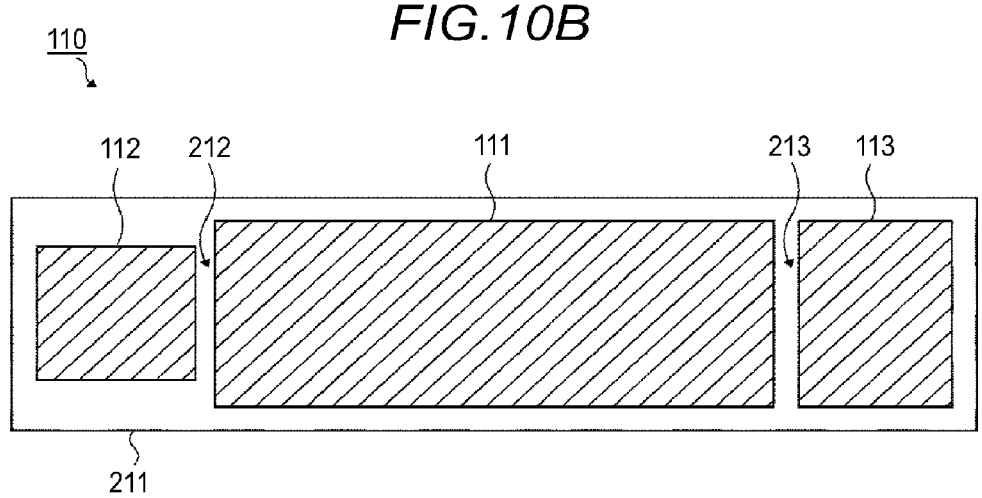

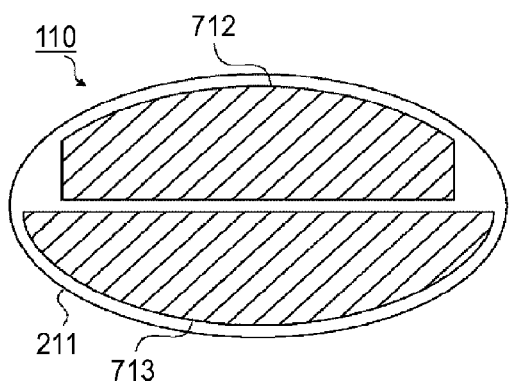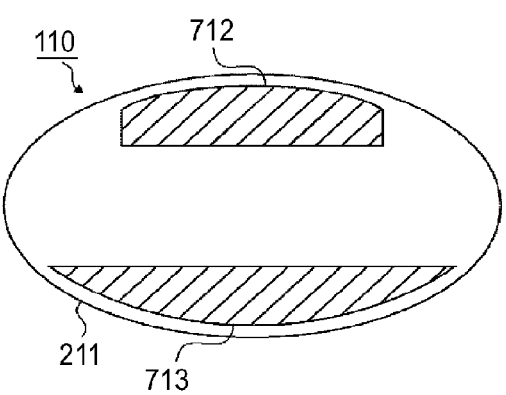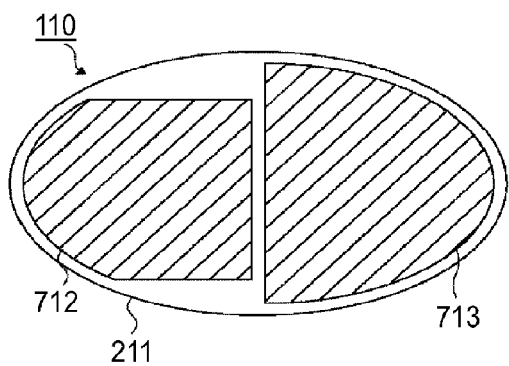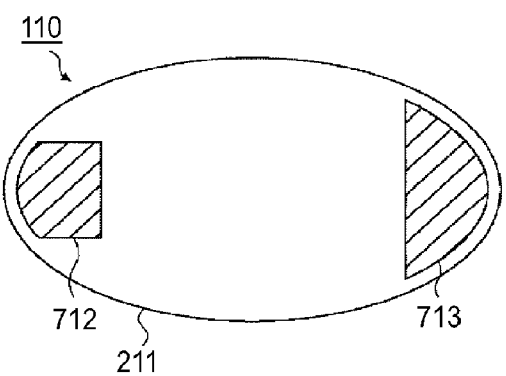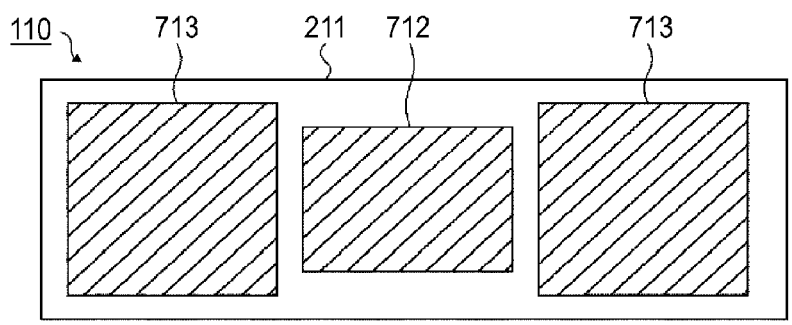

OPERATION DETECTING APPARATUS FOR VEHICLE

CROSS REFERENCE TO RELATED APPLICATIONS

This application is based on and claims priority under 35 U.S.C. §119 to Japanese Patent Application 2014-234149, filed on Nov. 19, 2014, the entire contents of which are incorporated herein by reference.

TECHNICAL FIELD

This disclosure relates to an operation detecting apparatus for a vehicle in which a capacitance sensor is used.

BACKGROUND DISCUSSION

A capacitance sensor configured to detect positions or actions of detected objects by a change in capacitance is known. The capacitance sensor includes one or more electrodes for detection. When the detected object approaches the electrode for detection, a capacitance value generated between an electrode and an electrode, or between an electrode and the ground varies. The capacitance sensor is an apparatus configured to detect actions of the detected objects by measuring the change in capacitance value as an electric signal.

JP 2006-213206 A discloses a vehicle window sensor configured to detect variations in capacitance between two electrodes including a sensor electrode installed on a window glass of a vehicle as one electrode, and a vehicle body as the other electrode.

The vehicle window sensor disclosed in JP 2006-213206 A is configured to detect the capacitance between the electrode on the window glass and the vehicle body and thus has a wide detecting area. In the case where the vehicle window sensor is used as an operation detecting unit, the vehicle window sensor has a potential to detect operation erroneously even though a user does not perform operation such as the case where a person passes near by the vehicle at the time of parking.

SUMMARY

Thus, a need exists for an operation detecting apparatus for a vehicle which is not suspectable to the drawback mentioned above.

An aspect of this disclosure provides an operation detecting apparatus for a vehicle including a detecting unit having a first electrode and a second electrode configured to detect variations in a capacitance value; a capacitance measuring unit configured to measure a first capacitance value detected by the first electrode and a second capacitance value detected by the second electrode; a determining unit configured to compare a value on the basis of the amount of variations in the first capacitance value with a value on the basis of an amount of variations in the second capacitance value and determine presence or absence of operation from a user on the basis of the result of comparison; and an output unit configured to output a control signal on the basis of a result of determination of the determining unit.

BRIEF DESCRIPTION OF THE DRAWINGS

The foregoing and additional features and characteristics of this disclosure will become more apparent from the following detailed description considered with the reference to the accompanying drawings, wherein:

FIGS. 10A and 10B are drawings illustrating a modification of a mutual-capacitance type capacitance sensor electrode; and FIGS. 11A to 11E are drawings illustrating a modification of a self-capacitance type capacitance sensor electrode.

DETAILED DESCRIPTION

Figure 1A:
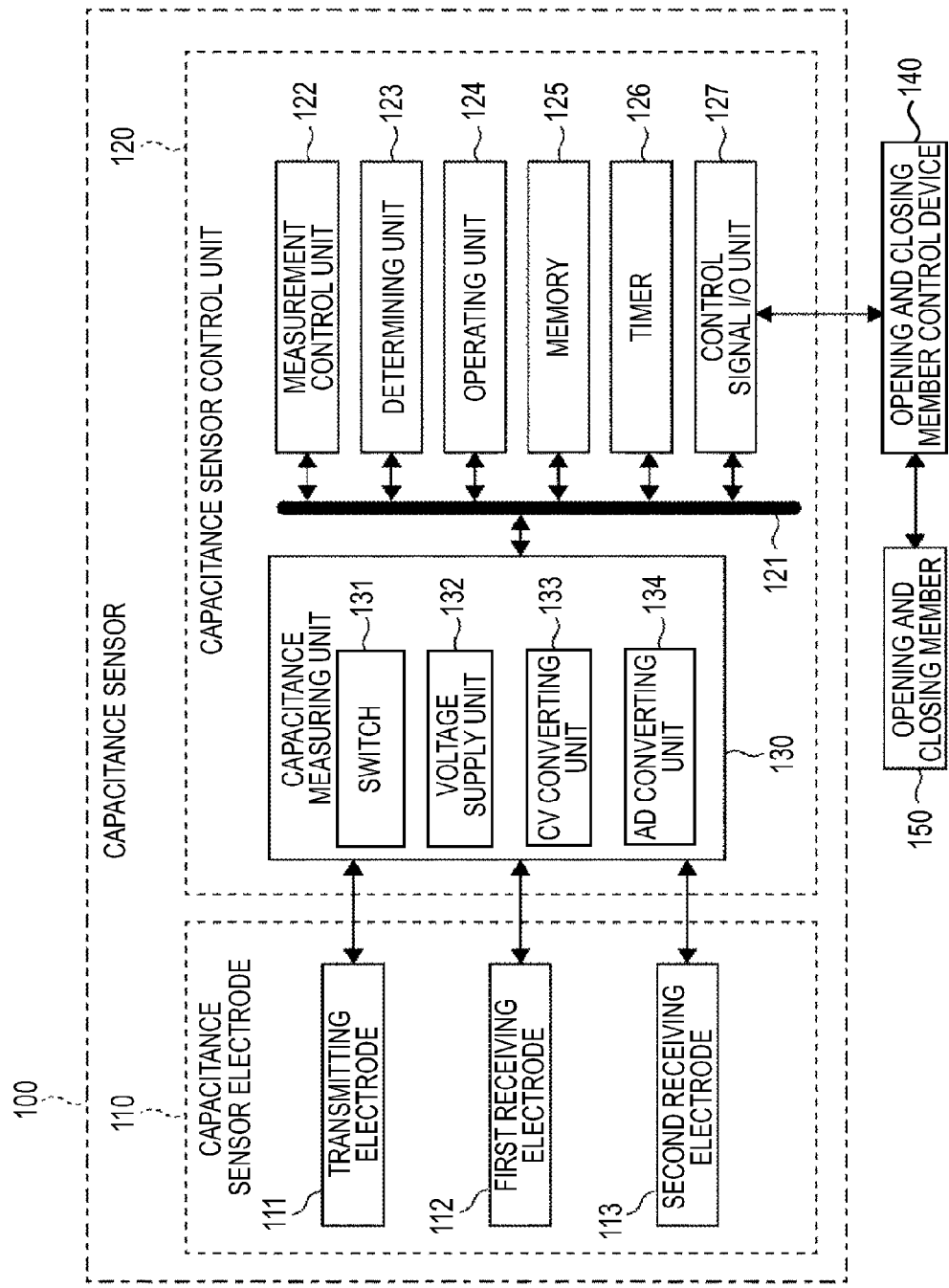
FIG. 1A is a block diagram illustrating a configuration of a capacitance sensor of an opening and closing member for a vehicle according to a first embodiment.

Exemplary embodiments for implementing this disclosure will be described with reference to the drawings. However, unless otherwise specifically noted, the scope of this disclosure is not limited to modes described in detail in the embodiments set forth below. In the drawings which will be described below, the same components having the same functions are denoted by the same reference numerals, and repeated descriptions may be omitted.

First Embodiment

FIG. 1A is a block diagram illustrating a configuration of an operation detecting unit used for an opening and closing member for a vehicle (slide door, rear door, and the like)

according to a first embodiment disclosed here. A capacitance sensor 100, which corresponds to the operation detecting unit used for the opening and closing member for a vehicle includes a capacitance sensor electrode 110 and a capacitance sensor control unit 120. The capacitance sensor electrode 110 is a detecting unit of the capacitance sensor 100 configured to detect operation of the opening and closing member for a vehicle by a user. The capacitance sensor control unit 120 is a portion configured to control operation of the capacitance sensor electrode 110 and output the result of detection obtained by the capacitance sensor electrode 110 to an opening and closing member control device 140.

The capacitance sensor 100 of the embodiment is of a mutual-capacitance type. The capacitance sensor electrode 110 includes a transmitting electrode 111, a first receiving electrode 112, and a second receiving electrode 113. The transmitting electrode 111 is an electrode configured to generate lines of electric force by applying voltage, and the first receiving electrode 112 and the second receiving electrode 113 are electrodes that receive the lines of electric force. Accordingly, capacitance is generated between the transmitting electrode 111 and the first receiving electrode 112 and between the transmitting electrode 111 and the second receiving electrode 113. The capacitance sensor 100 of the embodiment is configured to detect approach and separation of a detected object such as a hand of the user by measuring variations in capacitance.

The capacitance sensor electrode 110 may be installed at any position of the vehicle as long as the user can operate and the lines of electric force are not interrupted by the conductive member. For example, the capacitance sensor electrode 110 may be installed on a door handle, a center pillar (a column on the side surface of the vehicle and provided at a position between a front seat and a rear seat), a center pillar garnish, a belt molding, a rear side of an emblem, a rear door garnish, and a bumper. The capacitance sensor electrode 110 may be installed on a movable member of an opening and closing member 150 for the vehicle or may be installed in other portions. Furthermore, in a case where a portion of the member which constitutes the opening and closing member is not formed of a metal, the capacitance sensor electrode 110 may be installed on an inner side of a portion which is not formed of the metal.

The capacitance sensor control unit 120 includes a bus 121, a measurement control unit 122, a determining unit 123, an operating unit 124, a memory 125, a timer 126, a control signal I/O unit 127, and a capacitance measuring unit 130. The bus 121 is wiring configured to connect respective portions of the capacitance sensor control unit 120. The capacitance measuring unit 130 is a portion that measures a capacitance between the respective electrodes of the capacitance sensor electrode 110.

The control signal I/O unit 127 is a portion corresponding to an interface that sends and receives a signal between the capacitance sensor measuring unit 120 and the opening and closing member control device 140. The control signal I/O unit 127 functions as an output unit configured to output a signal relating to a user operation such as presence or absence of the operation by the user by using the capacitance sensor electrode 110 to the opening and closing member control device 140. The control signal I/O unit 127 functions also as an input unit configured to receive signals which indicate the state of the opening and closing member 150 (opened state and closed state) from the opening and closing member control device 140.

The opening and closing member control device 140 is, for example, an ECU (Electronic Control Unit) mounted on a vehicle, and controls an opening and closing operation of the opening and closing member 150 on the basis of the signal indicating the operation by the user input from the control signal I/O unit 127 of the capacitance sensor control unit 120. The opening and closing member 150 is an opening and closing member for a vehicle configured to perform an opening and closing operation automatically by a drive source such as a motor. More specifically, the opening and closing member 150 may include a slide door, a sun roof, a rear door, a power window, a swing door and the like. The opening and closing member 150 is provided with a sensor configured to detect a state of operation of the drive source. For example, the opening and closing member 150 may be provided with a pulse sensor using a Hall element as a sensor configured to detect a rotation of the motor. An output from the sensor is output from the opening and closing member 150 to the opening and closing member control device 140, and is input into the determining unit 123 via the control signal I/O unit 127 of the capacitance sensor control unit 120. The output of the sensor may be held once in the memory 125 without being directly input into the determining unit 123, and then read out by the determining unit 123.

The measurement control unit 122 is a portion configured to control a state of measurement of the capacitance measuring unit 130. For example, the state of connection of the switch 131 is switched by the output signal from the measurement control unit 122. Accordingly, either one of measurement by the first receiving electrode 112 and measurement by the second receiving electrode 113 may be selected.

The memory 125 includes a ROM and a RAM, and is a memory medium configured to temporarily or permanently memorise data such as an output value from the capacitance measuring unit 130, time or duration of output from the timer 126, or the state of the opening and closing member 150 output from the opening and closing member control device 140. The memory 125 supplies data memorised in accordance with instruction from the determining unit 123 and the operating unit 124. The timer 126 is a portion configured to provide time information to the respective members.

The determining unit 123 is a portion configured to determine whether or not normal operation is performed by the user on the basis of the output value from the capacitance measuring unit 130 memorised in the memory 125. The normal operation is a specific operating procedure which is performed when the user indicates a wish to open or close the opening and closing member 150.

The operating unit 124 is a portion configured to perform reduction of noise, offset elimination, and various computations for data processing such as multiplication of coefficient on an output signal indicating the capacitance value output from the capacitance measuring unit 130.

Figure 1B:
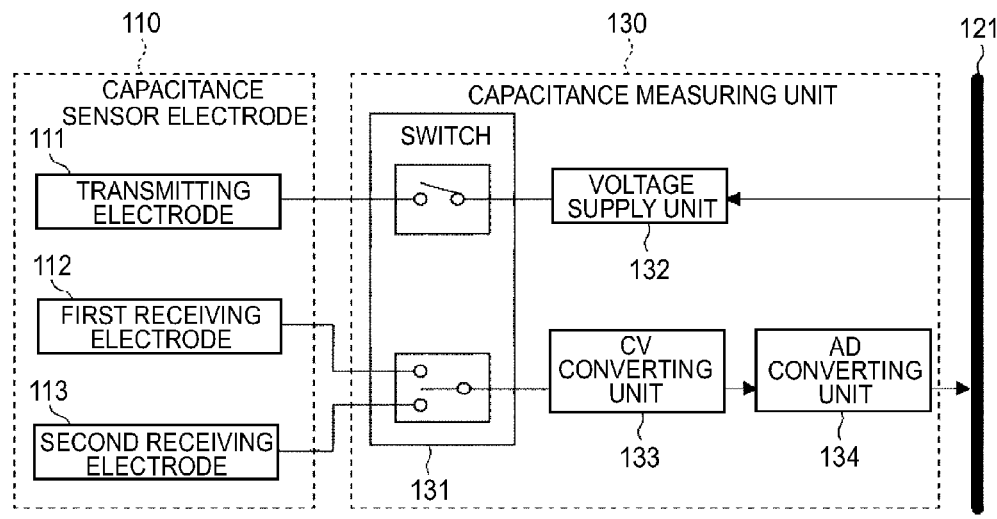
FIG. 1B is a block diagram illustrating a configuration of a capacitance measuring unit of the opening and closing member for a vehicle according to the first embodiment.

FIG. 1B is a block diagram illustrating a configuration of a capacitance measuring unit of an opening and closing member for a vehicle according to the first embodiment. The capacitance measuring unit 130 includes a switch 131, a voltage supply portion 132, a CV (Capacitance-to-Voltage) converting unit 133, and an AD (Analogue-to-Digital) converting unit 134.

The voltage supply portion 132 is a portion configured to supply a voltage for outputting the lines of electric force to the transmitting electrode 111 in accordance with the control signal from the measurement control unit 122 input via the bus 121. The voltage supply portion 132 may include a voltage conversion circuit, an amplifier circuit, and the like for adjusting the voltage to be supplied to the transmitting electrode 111.

The switch 131 is a portion configured to change over connections of the electrodes, for example, for selecting an electrode that measures the capacitance. The switch 131 includes a portion that switches ON and OFF between the transmitting electrode 111 and the voltage supply portion 132. The switch 131 further includes a portion that switches the connection of the CV converting unit 133 either to the first receiving electrode 112 or to the second receiving electrode 113.

The CV converting unit 133 is a CV conversion circuit configured to convert the capacitance between the transmitting electrode 111 and the first receiving electrode 112 or the capacitance between the transmitting electrode 111 and the second receiving electrode 113 into a voltage value and output the voltage value. The CV converting unit 133 may include an amplifier configured to vary an output voltage at the time of CV conversion.

The AD converting unit 134 is an AD conversion circuit configured to convert the voltage value output from the CV converting unit 133 to a digital signal and output the digital signal. The digital signal indicating a capacitance value output from the AD converting unit 134 is held in the memory 125 via the bus 121.

In the first embodiment, the capacitance measuring unit 130 includes a circuit configured to perform measurement of the capacitance by the CV conversion circuit. However, measurement of the capacitance may be performed by other methods. For example, a capacitance measuring method with various circuits such as a circuit configured to repeatedly transfer an electric charge to a reference capacitive element and count the number of times of transfer, or a CR resonance circuit.

One of more functional portions disclosed here and illustrated in FIG. 1A and FIG. 1B may be provided by hardware, or may be provided by programs which are operated on hardware of a computer including a CPU (Central Processing Unit). These programs may be stored in the memory 125.

Figure 2A:
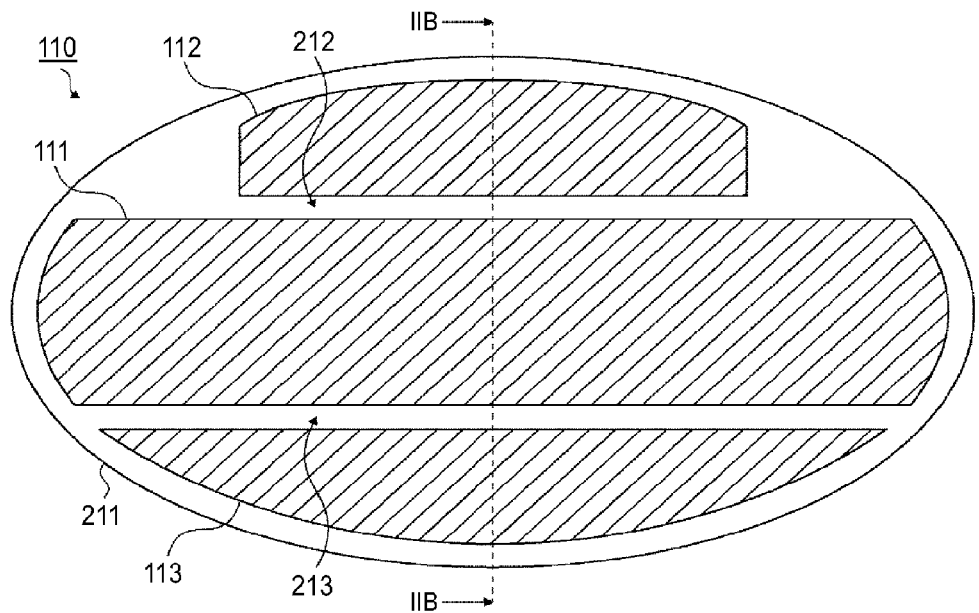
FIG. 2A is a drawing illustrating a configuration of a capacitance sensor electrode according to the first embodiment.
Figure 2B:
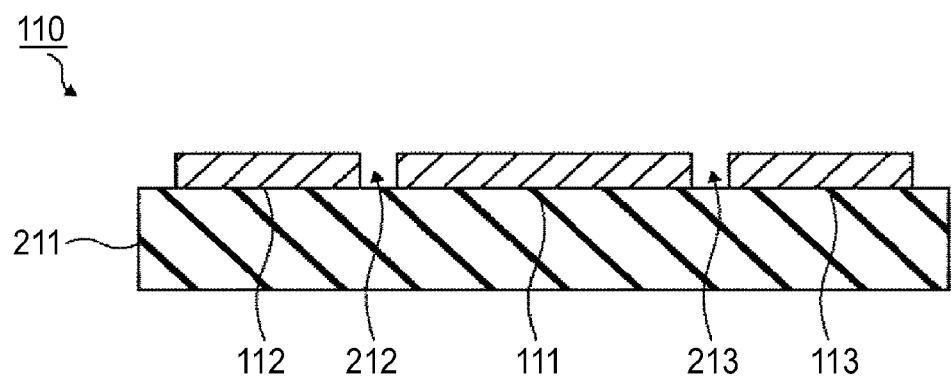
FIG. 2B is a cross-sectional view of the capacitance sensor electrode according to the first embodiment taken along a line IIB-IIB'.

FIG. 2A is a drawing illustrating a configuration of the capacitance sensor electrode 110 according to the first embodiment. FIG. 2B is a cross-sectional view of the capacitance sensor electrode according to the first embodiment taken along a line IIB-IIB'. The transmitting electrode 111, the first receiving electrode 112, and the second receiving electrode 113 of the capacitance sensor electrode 110 are formed on a main surface of a thin-plate-shaped base member 211. The base member 211 is formed of a high-resistance material or an insulative material such as resin, glass, and ceramics. The base member 211 has an elliptical shape. The transmitting electrode 111 is arranged in the vicinity of a long axis of the base member 211. The first receiving electrode 112 and the second receiving electrode 113 are arranged on both sides of the transmitting electrode 111. A gap 212 is formed between the first receiving electrode 112 and the transmitting electrode 111. A gap 213 is formed between the second receiving electrode 113 and the transmitting electrode 111. The length in a long side direction of the first receiving electrode 112 is smaller than that of the second receiving electrode 113. In other words, a surface area of the first receiving electrode 112 is smaller than a surface area of the second receiving electrode 113. Arrangement and shapes of the base member 211, the transmitting electrode 111, the first receiving electrode 112, the second receiving electrode 113, and the gaps 212 and 213 as illustrated in FIG. 2A are not essential and may be modified as needed.

Figure 2C:
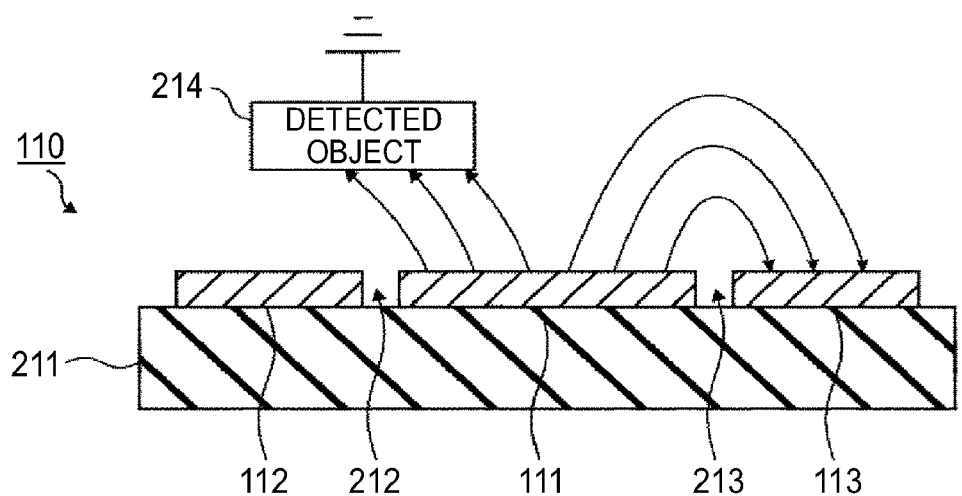
FIG. 2C is a drawing illustrating detection of capacitance variations in the capacitance sensor electrode according to the first embodiment.

FIG. 2C is a drawing illustrating detection of the capacitance variations in the capacitance sensor electrode 110 according to the first embodiment. When a voltage is applied to the transmitting electrode 111, lines of electric force are transmitted from the transmitting electrode 111. Some of the lines of electric force transmitted from the transmitting electrode 111 are received by the first receiving electrode 112. Accordingly, capacitance is generated between the transmitting electrode 111 and the first receiving electrode 112. In the same manner, the capacitance is also generated between the transmitting electrode 111 and the second receiving electrode 113.

FIG. 2C illustrates a distribution of the lines of electric force in the case where a detected object 214 having conductivity such as a human hand approaches the gap 212 between the transmitting electrode 111 and the first receiving electrode 112. The detected object 214 equivalently functions as the ground, and thus the lines of electric force transmitted from the transmitting electrode 111 are interrupted by the detected object 214. Accordingly, the capacitance between the transmitting electrode 111 and the first receiving electrode 112 is reduced. The reduction of the capacitance is measured via the first receiving electrode 112, so that approach and separation of the detected object 214 are detected. The same applies to the case where the detected object 214 approaches the second receiving electrode 113. In other words, the capacitance sensor electrode 110 of the first embodiment has two detecting areas, and thus is applicable to measurement in two channels. In this specification, the detecting area indicates a spatial range in which variations in capacitance can be detected when the detected object 214 enters.

In this manner, the capacitance sensor electrode 110 of the first embodiment includes two detecting areas on the basis of a capacitance value (first capacitance value) between the transmitting electrode 111 and the first receiving electrode 112 and a capacitance value (second capacitance value) between the transmitting electrode 111 and the second receiving electrode 113. On the basis of the control from the measurement control unit 122, the capacitance measuring unit 130 measures these capacitance values repeatedly and continuously or intermittently to cause the memory 125 to hold data indicating the first capacitance value and data indicating the second capacitance value repeatedly.

The determining unit 123 of the capacitance sensor 100 according to the first embodiment determines whether or not the detected object has approached on the basis of an amount of variations $\Delta C1$ of the first capacitance value, and determines whether or not the amount of variations $\Delta C1$ of the first capacitance value is a variation caused by the user operation on the basis of an amount of variations $\Delta C2$ of the second capacitance value. In other words, the first receiving electrode 112 functions as a detecting electrode for the user operation, and the second receiving electrode 113 functions as the electrode for detecting erroneous detection. Accordingly, the erroneous detection caused by the variations in capacitance not on the basis of the user intention. The determination of the user operation will be described.

Hereinafter, $\Delta C1$ and $\Delta C2$, which are "amount of variations in capacitance value" are each defined to mean an absolute value of a difference between a measured value of the capacitance at a certain point of time and a reference capacitance value when the detected object does not approach. In the first embodiment, since the capacitance sensor 100 is of the mutual-capacitance type, if the detected object approaches the capacitance sensor electrode 110, the capacitance value decreases. However, since the "amount of variations in capacitance value" is absolute values, the capacitance value is a positive value.

In the case where the first capacitance value or the second capacitance value varies, the determining unit 123 determines absence or presence of the user operation in accordance with a table given below in the case where the first capacitance value or the second capacitance value varies.

TABLE 1

|  | Condition A | Condition B | Condition C |
| --- | --- | --- | --- |
| ΔC1 | ΔC1 < threshold value | ΔC1 ≥ threshold value | ΔC1 ≥ threshold value |
| ΔC2 | any value | ΔC1 < ΔC2 | ΔC1 ≥ ΔC2 |
| Determination of User Operation | No user operation | No user operation | User operation is performed |
| State of Sensor | No detected object | Detected object is present but not user operation | User is operating |

Condition A is a condition in which the detected object 214 such as a person or the like is not in proximity to the capacitance sensor electrode 110. In this condition, the amount of variations ΔC1 of the first capacitance value indicates zero or a sufficiently small value. When a predetermined threshold set in view of noise or the like has a relationship ΔC1<threshold value, the determining unit 123 determines that the condition falls under Condition A and thus the user operation is not performed. In this case, the amount of variations ΔC2 of the second capacitance value is not used for determination.

Condition B is a condition in which the detected object 214 such as a person or the like is in proximity to the capacitance sensor electrode 110 but no user operation is performed. As a specific example, a case where the person is standing near the capacitance sensor electrode 110 but that person has no intention to open or close the opening and closing member 150 is exemplified.

Figure 3:
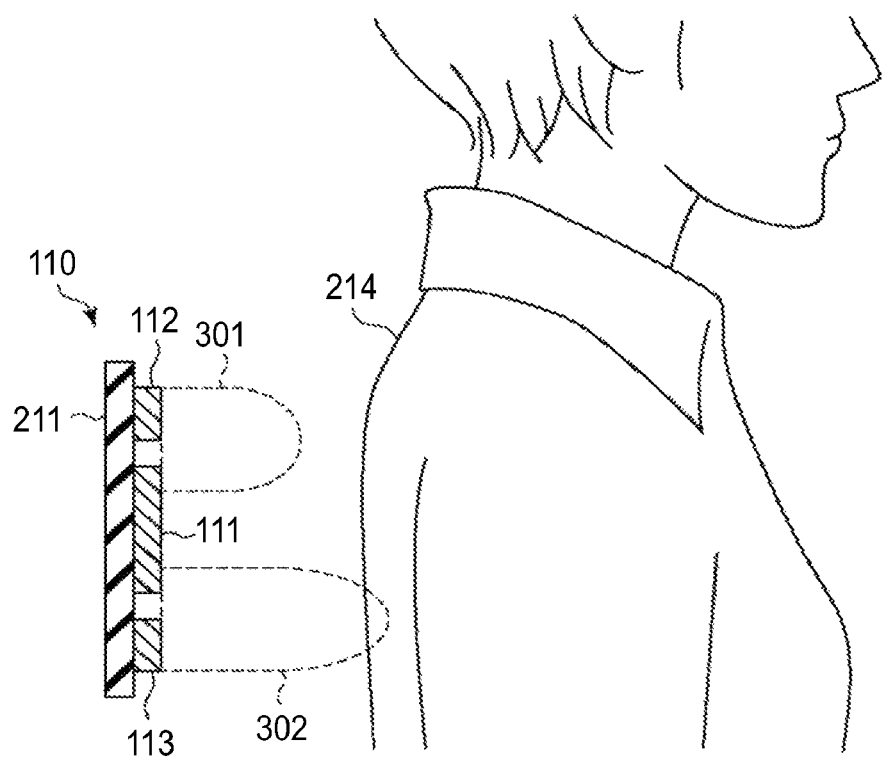
FIG. 3 is a drawing illustrating a condition in which a person stands near by the capacitance sensor electrode.

FIG. 3 is a drawing illustrating a condition in which a person is standing near by the capacitance sensor electrode 110, which corresponds to Condition B. The capacitance sensor electrode 110 illustrated in FIG. 2A to FIG. 2C is installed vertically, and the person stands nearby with his or her back facing thereto. At this time, a first detecting area 301 is formed by the lines of electric force between the transmitting electrode 111 and the first receiving electrode 112 in the vicinity of the capacitance sensor electrode 110. In the same manner, a second detecting area 302 is formed by the lines of electric force between the transmitting electrode 111 and the second receiving electrode 113. As described above, the surface area of the first receiving electrode 112 is smaller than the surface area of the second receiving electrode 113, and thus the first detecting area 301 is smaller than the second detecting area 302. In other words, in Condition B, the amount of variations ΔC1 of the first capacitance value caused by the back of the person as the detected object 214 is smaller than the amount of variations ΔC2 of the second capacitance value. Therefore, when relationships ΔC1≥threshold value and ΔC1<ΔC2 are satisfied, the determining unit 123 determines that the condition falls under Condition B, and the user operation is not performed.

Figure 4A:
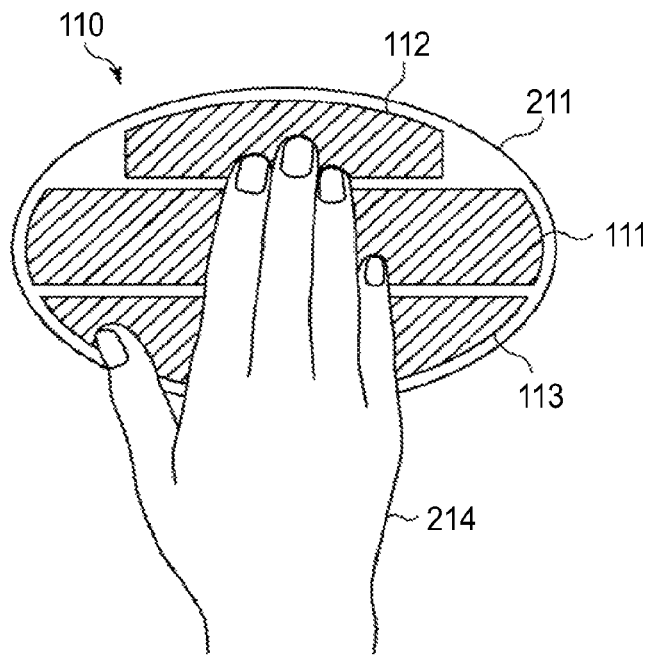
FIG. 4A is a drawing illustrating a condition in which a user operates the capacitance sensor electrode by hand.
Figure 4B:
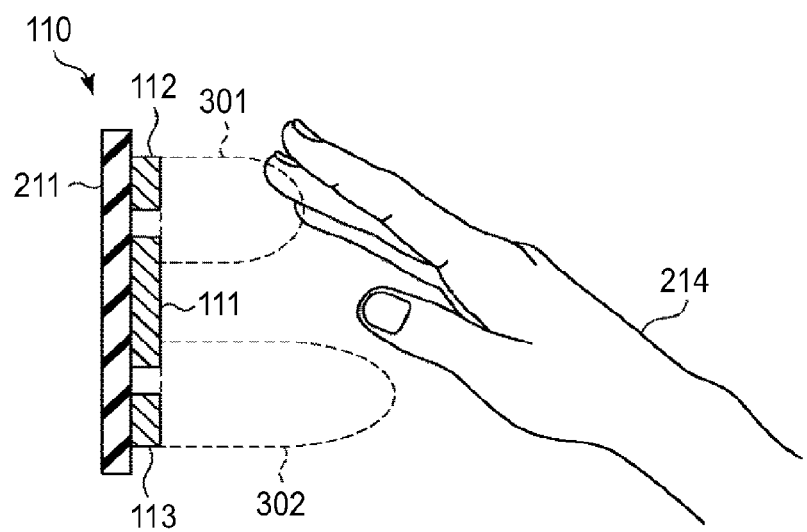
FIG. 4B is a drawing illustrating a condition in which the user operates the capacitance sensor electrode by hand.

Condition C is a condition in which the user operates the capacitance sensor electrode 110 with an intention to open and close the opening and closing member 150. FIG. 4A and FIG. 4B are drawings illustrating a state in which the user operates the capacitance sensor electrode 110 with his or her hand. FIG. 4A is a drawing of the capacitance sensor electrode 110 viewing from the front, and FIG. 4B is a drawing of the capacitance sensor electrode 110 viewing from the side.

As illustrated in FIG. 4A and FIG. 4B, normal operation of the capacitance sensor 100 of the first embodiment is an action of the user approaching fingertips to the position near by the first receiving electrode 112 (holding operation). In this case, as illustrated in FIG. 4B, fingers are in the proximity to the first detecting area 301, but the fingers or the palm does not approach the position near by the second detecting area 302. In other words, in Condition C, the amount of variations ΔC1 of the first capacitance value caused by the hand of the person as the detected object 214 is not smaller than the amount of variations ΔC2 of the second capacitance value. Therefore, when relationships ΔC1≥threshold value and ΔC1≥ΔC2 are satisfied, the determining unit 123 determines that the condition falls under Condition C, and the user operation is performed.

Figure 5A:
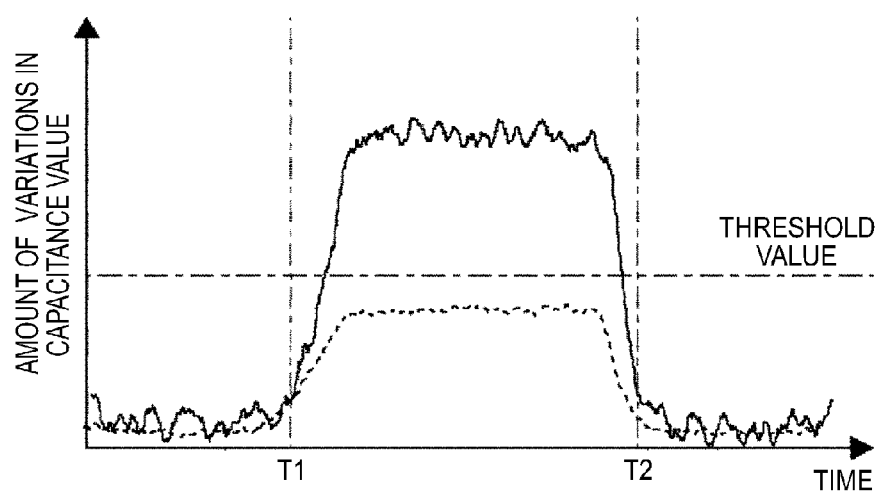
FIGS. 5A and 5B are graphs illustrating amount of variations in capacitance value when a detected object is brought closer and then away from the capacitance sensor electrode.
Figure 5B:
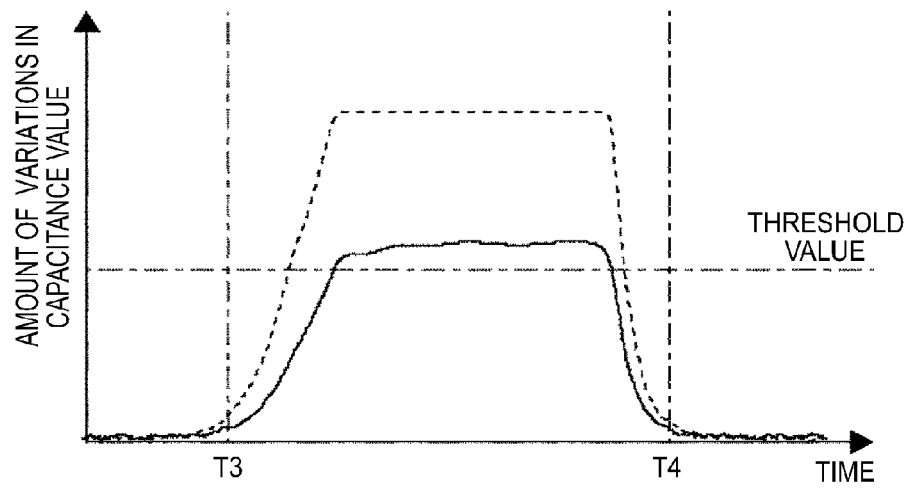

FIGS. 5A and 5B are graphs illustrating relationships between the amount of variations ΔC1 of the first capacitance value and the amount of variations ΔC2 of the second capacitance value with time when the detected object is approached and then separated. In the respective graphs, solid lines indicate the amount of variations ΔC1 of the first capacitance value, and broken lines indicate the amount of variations ΔC2 of the second capacitance value. At clock times T1 and T3, the detected object starts to approach the detecting area of the capacitance sensor electrode 110, and at clock times T2 and T4, the detected object leaves the detecting area of the capacitance sensor electrode 110.

FIG. 5A illustrates variations in capacitance value when the user operation is performed. From the drawing, the amount of variations ΔC1 of the first capacitance value is larger than the threshold value when the detected object approaches, and is larger than the amount of variations ΔC2 of the second capacitance value. In other words, relationships ΔC1≥threshold value and ΔC1≥ΔC2 are satisfied, and the determining unit 123 determines that the condition falls under Condition C and the user operation is performed.

FIG. 5B illustrates variations in capacitance value when the substance having a large surface area which corresponds to the back of a person approaches the capacitance sensor electrode 110. From the drawing, when the detected object approaches, the amount of variations ΔC1 of the first capacitance value is larger than the threshold value, and is smaller than the amount of variations ΔC2 of the second capacitance value. In other words, relationships ΔC1≥threshold value and ΔC1<ΔC2 are satisfied, and the determining unit 123 determines that the condition falls under Condition B and the user operation is not performed.

In this manner, by the determination on the basis of a plurality of the amounts of variations in capacitance value, the determining unit 123 is capable of determining the presence or absence of the user operation correctly, and the erroneous operation caused by the capacitance variations which are not generated by the normal operation is prevented.

Figure 6:
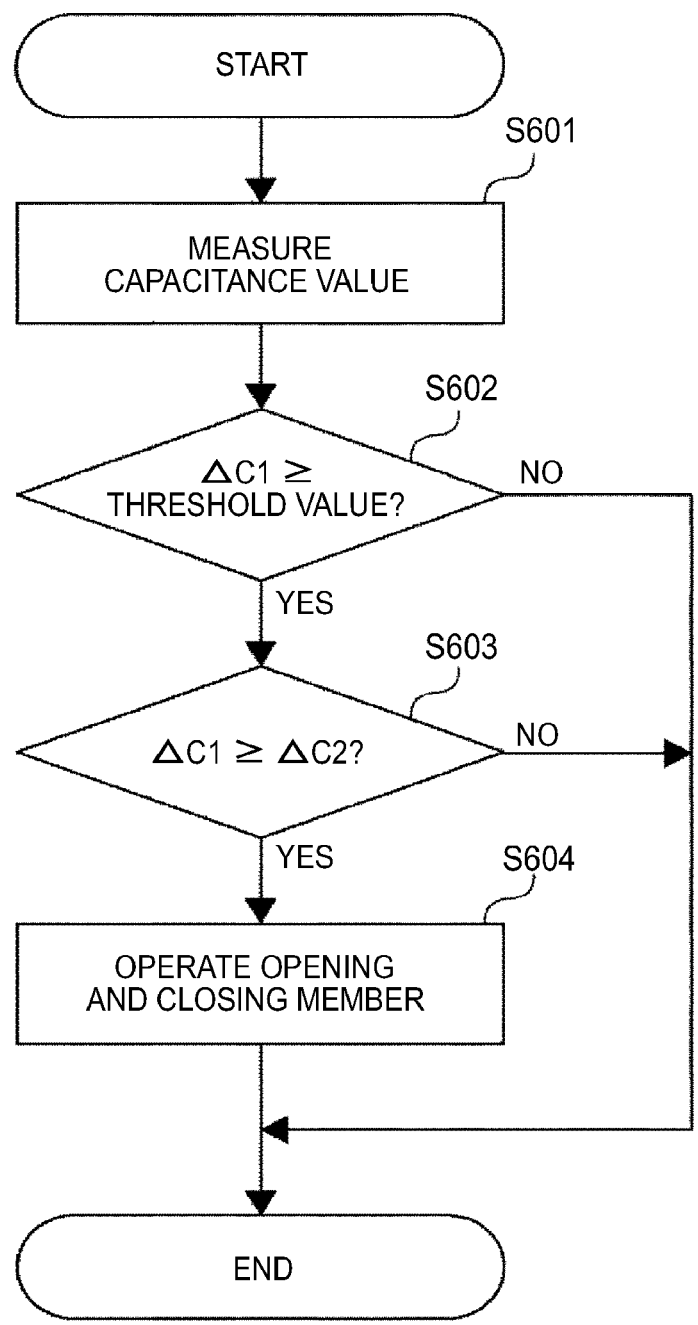
FIG. 6 is a flow chart illustrating a method of controlling the capacitance sensor according to the first embodiment.

FIG. 6 is a flowchart illustrating a method of controlling the capacitance sensor 100 according to the first embodiment. The flowchart of FIG. 6 describes a control flow when the user performs the opening and closing operation with respect to the capacitance sensor electrode 110 when the opening and closing member 150 is stopped or is operated.

This flowchart is illustrated so as to start from START and end at END. However, since the timing when the user performs the operation is irregular, the control flow is preferably performed continuously or intermittently in a repeated manner. However, under the condition in which the opening and closing operation of the opening and closing member 150 does not seem to be performed, such as during travel, this control flow may be stopped.

In Step S601, the capacitance sensor 100 measures the capacitance value for detecting the holding operation by the user. Specifically, the capacitance measuring unit 130 performs measurement of the capacitance value between the transmitting electrode 111 and the first receiving electrode 112 (first capacitance value) and measurement of the capacitance value between the transmitting electrode 111 and the second receiving electrode 113 (second capacitance value) alternately in a repeated manner, and causes the memory 125 to hold a result of measurement.

In Step S602, the determining unit 123 determines whether or not the amount of variations $\Delta C1$ of the first capacitance value is larger than the predetermined threshold value. In the case where the relationship $\Delta C1 <$threshold value is satisfied, the determining unit 123 determines that the condition falls under Condition A, and the user operation is not performed (NO in step S602). The flow is then terminated. In the case where the relationship $\Delta C1 \geq$threshold value is satisfied, the flow proceeds to Step S603 (YES in Step S602).

In Step S603, the determining unit 123 determines whether or not the amount of variations $\Delta C1$ of the first capacitance value is larger than the amount of variations $\Delta C2$ of the second capacitance value. If the relationship $\Delta C1 < \Delta C2$ is satisfied, the determining unit 123 determines that the condition falls under Condition B, the user operation is not performed (NO in Step S603). The flow is then terminated. If the relationship $\Delta C1 \geq \Delta C2$ is satisfied, the determining unit 123 determines that the condition falls under Condition C, and the user operation is performed (YES in Step S603). In this case, the flow proceeds to Step S604.

In Step S604, the determining unit 123 outputs a signal indicating that the user has performed operation for stopping the action of the opening and closing member 150 to the opening and closing member control device 140. Accordingly, the opening and closing member control device 140 controls the opening and closing member 150 to stop. When the stop control is performed, the flow is terminated.

The order of Step S602 and Step S603 may be vise versa or may be simultaneous. The flow may be modified so as to determine that the user has performed operation in the case where both of conditions determined in Step S602 and Step S603 are continued for a predetermined period.

In the first embodiment, the first receiving electrode 112 functions as a detecting electrode for the user operation, and the second receiving electrode 113 functions as the electrode for detecting erroneous detection. Even though the first receiving electrode 112 detects the variations in the capacitance, if the second receiving electrode 113 detects larger variations in capacitance, it is determined to be the erroneous detection, and thus erroneous operation due to the capacitance variations, which is not caused by normal operation is prevented. Therefore, for example, a potential to detect operation erroneously which may occur when the person is in proximity to the capacitance sensor electrode 110 but does not perform operation is reduced.

As examples of the capacitance variations which may be caused not by the normal operation as described above, the case where a person, an animal, or a vehicle passes near by the capacitance sensor electrode 110, and the case where the vehicle is parked near by the capacitance sensor electrode 110 are assumed. In such cases as well, the potential to detect operation erroneously is reduced in the same manner. A potential to detect operation erroneously which may occur when foreign substances such as water droplets, frost, snow, mud, and the like are adhered to the capacitance sensor electrode 110 may also be reduced.

In the illustration in FIG. 2A, the first receiving electrode 112 in the drawing is arranged on an upper side of the transmitting electrode 111, and the second receiving electrode 113 is arranged on a lower side of the transmitting electrode 111. The arrangement of the electrodes is not limited thereto. Further preferably, however, when the capacitance sensor electrode 110 of the first embodiment is installed on the side surface of the vehicle such as the slide door or the rear door, the first receiving electrode 112 is arranged on an upper side of the transmitting electrode 111 and the second receiving electrode 113 is arranged on the lower side of the transmitting electrode 111 in the same manner as illustrated in FIG. 2A. In other words, an upside and a downside of the capacitance sensor electrode 110 in FIG. 2A preferably match the upside and the downside thereof when being installed on the side surface of the vehicle. The same applies to embodiments described below.

In the case where the user operates the capacitance sensor electrode 110 with fingers as illustrated in FIGS. 4A and 4B, the palm of the user spontaneously comes to a position apart from the second receiving electrode 113 when the user operates the first receiving electrode 112 located on an upper side with his/her fingers. Accordingly, in the case where the normal operation is performed, variations in capacitance value satisfy the relationship $\Delta C1 \geq \Delta C2$ spontaneously. Therefore, accuracy of discrimination between the normal operation and the erroneous operation is improved.

In the first embodiment, the surface area of the first receiving electrode 112 is reduced to be smaller than the surface area of the second receiving electrode 113 as a method of reducing the size of the first detecting area 301 to be smaller than the second detecting area 302. However, the method is not limited thereto. For example, at the time of a CV conversion performed by the CV converting unit 133, the sizes of the detecting area may be adjusted by setting an amplification rate when converting the second capacitance value to a voltage value to be larger than an amplification rate when converting the first capacitance value into the voltage value. In the operating unit 124, the magnitudes of values used for determination may be adjusted by multiplying digital signals corresponding to the first capacitance value and the second capacitance value by a first coefficient and a second coefficient, respectively. In this case, by setting the second coefficient to be larger than the first coefficient, the size of the detecting area may be adjusted in the same manner as the case where the surface area of the first receiving electrode 112 is set to be smaller than the surface area of the second receiving electrode 113. It is also possible to multiply only the digital signal corresponding to the second capacitance value by a coefficient larger than "1", or to multiply only the digital signal corresponding to the first capacitance value by a coefficient smaller than "1". In the case of adjusting the size of the detecting area by these methods, the surface area of the first receiving electrode 112 and the surface area of the second receiving electrode 113 may be set as desired. For example, the surface area of the first receiving electrode 112 and the surface area of the second receiving electrode 113 may be the same, and the surface area of the first receiving electrode 112 may be larger than the surface area of the second receiving electrode 113.

Second Embodiment

In the first embodiment, the capacitance sensor of the mutual-capacitance type has been exemplified. However, the capacitance sensor may be of a self-capacitance type. Hereinafter, an example of the capacitance sensor of the self-capacitance type will be described as a second embodiment.

Figure 7A:
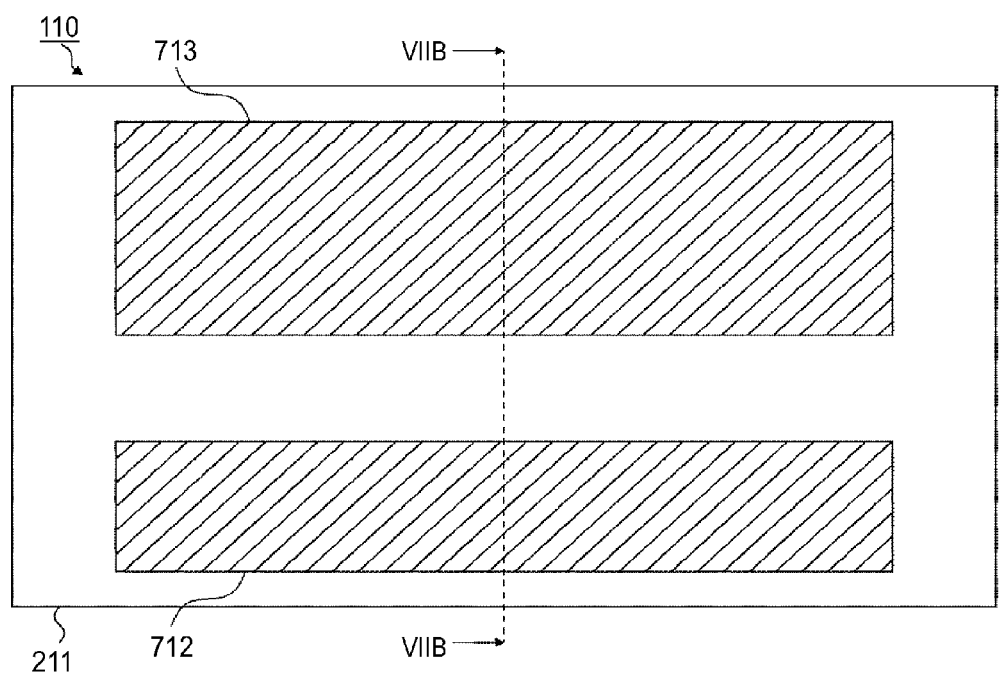
FIG. 7A is a drawing illustrating a configuration of a capacitance sensor electrode according to a second embodiment.
Figure 7B:
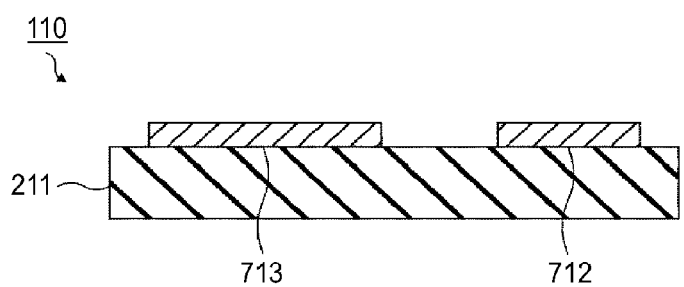
FIG. 7B is a cross-sectional view of the capacitance sensor electrode taken along a line VIIB-VIIB' in the second embodiment.

FIG. 7A is a drawing illustrating a configuration of a capacitance sensor electrode 110 according to the second embodiment. FIG. 7B is a cross-sectional view of the capacitance sensor electrode according to a third embodiment taken along a line VIIB-VIIB'. The capacitance sensor electrode 110 has a first detecting electrode 712 and a second detecting electrode 713 formed on the base member 211. The first detecting electrode 712 and the second detecting electrode 713 are arranged in parallel on the same surface of the base member 211. The base member 211, the first detecting electrode 712, and the second detecting electrode 713 all have a laterally elongated rectangular shape. A long side direction of the base member 211, the first detecting electrode 712, and the second detecting electrode 713 is substantially the same, and the lengths in the long side direction are substantially the same as well. The width (the length in a short side direction) of the first detecting electrode 712 is smaller than the width of the second detecting electrode 713. In other words, a surface area of the first detecting electrode 712 is smaller than a surface area of the second detecting electrode 713.

Figure 7C:
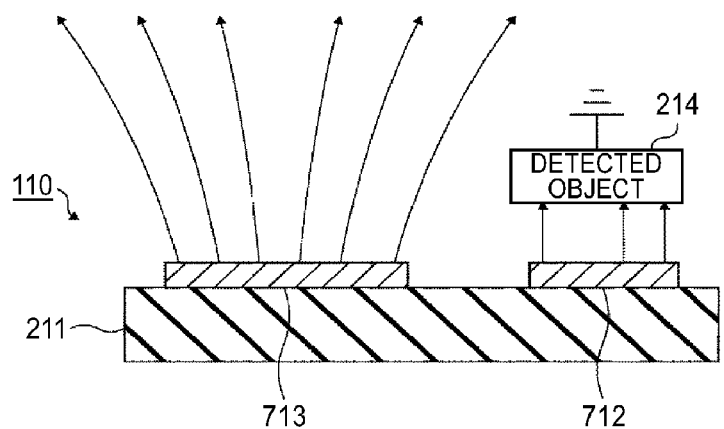
FIG. 7C is a drawing illustrating detection of the capacitance variations in the capacitance sensor electrode according to the second embodiment.

FIG. 7C illustrates a distribution of lines of electric force in the case where the detected object 214 approaches the position in the vicinity of the first detecting electrode 712. The detected object 214 equivalently functions as a ground. Therefore, some of the lines of electric force output from the first detecting electrode 712 are absorbed by the detected object 214. Accordingly, the capacitance generated by the first detecting electrode 712 is increased. The increase of the capacitance is measured via the first detecting electrode 712, so that approach of the detected object 214 is detected. The same applies to the case where the detected object 214 approaches the second detecting electrode 713.

The first detecting electrode 712 and the second detecting electrode 713 of the second embodiment have functions corresponding to the first receiving electrode 112 and the second receiving electrode 113 of the first embodiment, respectively. In other words, the first detecting electrode 712 functions as a detecting electrode for the user operation, and the second detecting electrode 713 functions as the electrode for detecting erroneous detection. A method of detection is the same as the first embodiment, and hence description will be omitted.

Figure 8:
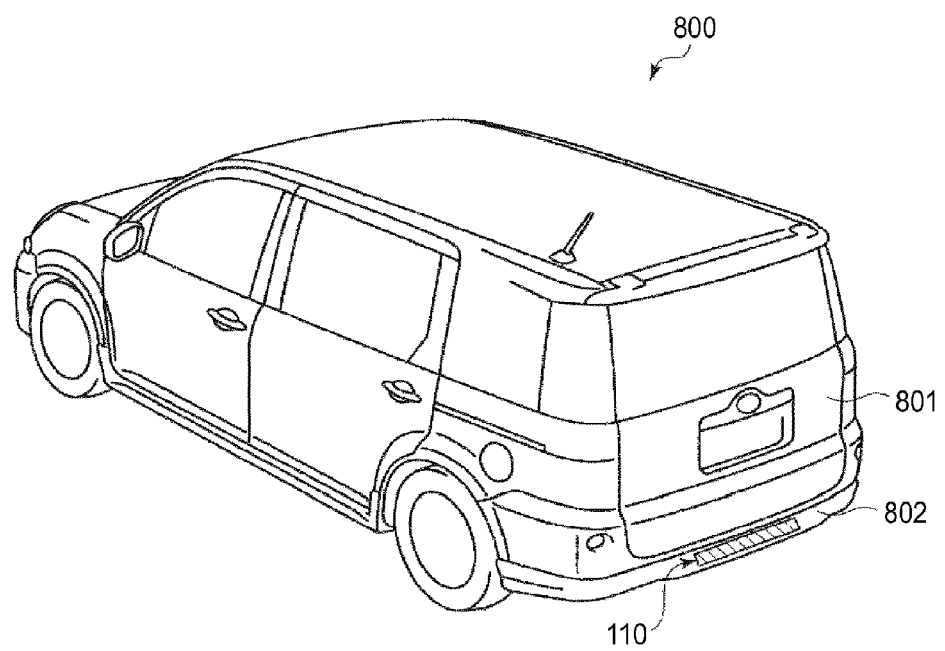
FIG. 8 is a drawing illustrating a mounting position of the capacitance sensor electrode on a vehicle according to the second embodiment.

The capacitance sensor electrode 110 of the second embodiment is preferably provided on a rear bumper of the vehicle because the user operates to open and close a rear door with his or her foot. FIG. 8 is a drawing illustrating a mounting position of the capacitance sensor electrode 110 on the vehicle according to the second embodiment. A vehicle 800 includes a rear door 801 and a rear bumper 802. The capacitance sensor electrode 110 is provided at a center portion of the rear bumper 802. The user is capable of opening and closing the rear door 801 by bringing his or her foot closer to or into contact with the rear bumper 802. In this configuration, even when the user holds luggage in both hands, operation with the foot is enabled. The position where the capacitance sensor electrode 110 is installed is not limited to the center portion of the rear bumper 802, and may be installed at a desired position.

Figure 9A:
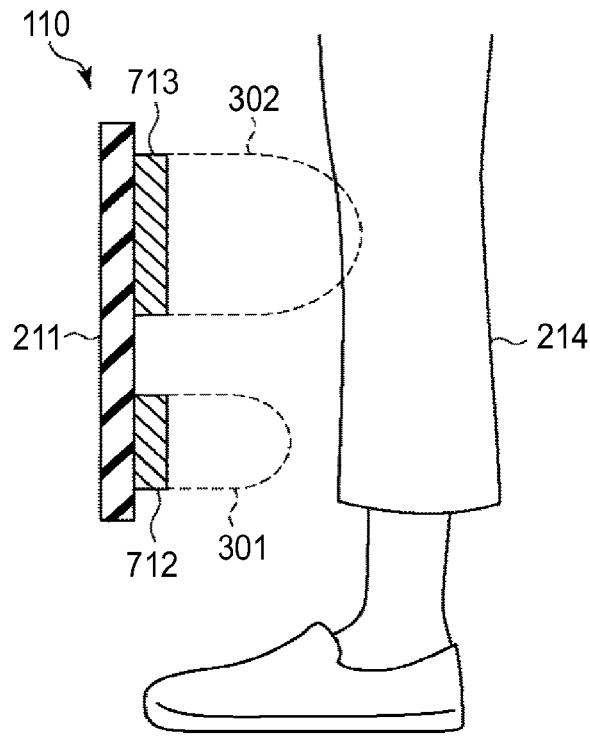
FIG. 9A is a drawing illustrating a condition in which a person stands near by the capacitance sensor electrode.

In the capacitance sensor 100 of the second embodiment disclosed here, an action of the user approaching his or her foot to the position near by the first detecting electrode 712 (holding operation) is normal operation. FIG. 9A is a drawing illustrating a condition in which a person stands near by the capacitance sensor electrode 110. This condition corresponds to Condition B in Table 1. In the same manner as the case in FIG. 3 of the first embodiment, the first detecting area 301 is smaller than the second detecting area 302. Therefore, the amount of variations ΔC1 of the first capacitance value caused by the foot of the person as the detected object 214 is smaller than the amount of variations ΔC2 of the second capacitance value. Therefore, in this case, since relationships ΔC1≥threshold value and ΔC1<ΔC2 are satisfied, the determining unit 123 determines that the condition falls under Condition B, and the user operation is not performed.

Figure 9B:
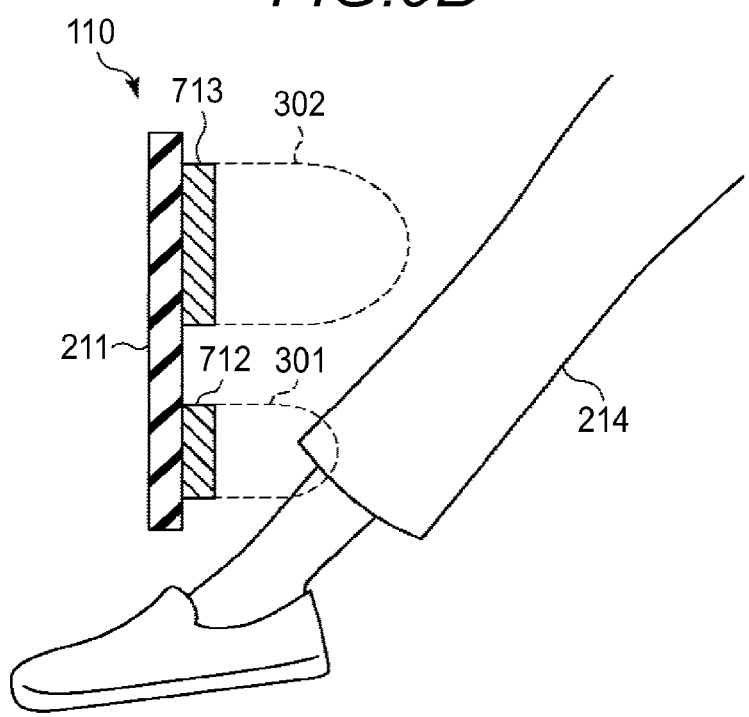
FIG. 9B is a drawing illustrating a condition in which a user operates the capacitance sensor electrode by foot.

In the case where the normal operation illustrated in FIG. 9B is performed, the foot approaches the first detecting area 301, but the foot does not approach the position near the second detecting area 302. In other words, in Condition C, the amount of variations ΔC1 of the first capacitance value caused by the foot of the person as the detected object 214 is not smaller than the amount of variations ΔC2 of the second capacitance value. Therefore, since relationships ΔC1≥threshold value and ΔC1≥ΔC2 are satisfied, the determining unit 123 determines that the condition falls under Condition C, and the user operation is performed.

As described above, according to the second embodiment, a capacitance sensor which allows operation of the opening and closing member of the vehicle with a foot is provided, and the potential to detect operation erroneously is reduced in the same manner as in the first embodiment.

In the illustration in FIG. 7A, the first detecting electrode 712 in the drawing is arranged on a lower side, and the second detecting electrode 713 is arranged on an upper side. The arrangement of the electrodes is not limited thereto. Further preferably, however, when the capacitance sensor electrode 110 of the second embodiment is installed on the rear bumper 802 of the vehicle 800, the first detecting electrode 712 is arranged on the lower side and the second detecting electrode 713 is arranged on the upper side in the same manner as illustrated in FIG. 7A. In the case where the user operates the capacitance sensor electrode 110 with his or her foot as illustrated in FIG. 9B, when the user operates the first detecting electrode 712 on the lower side with a portion near the toe, the portion of the user near the knee is located at a position away from the second detecting electrode 713 spontaneously. Therefore, the accuracy of discrimination between the normal operation and the erroneous operation is improved. In the second embodiment, the capacitance sensor of the self-capacitance type is exemplified. However, the sensor of the mutual-capacitance type as that described in the first embodiment is also applicable.

Other Embodiment

As other embodiments, a modification of the arrangement of the electrodes to which the capacitance sensor electrode 110 disclosed here is applied will be listed. A cross-sectional structure is the same as those in the first or second embodiment, and thus illustration and description will be omitted. In the following description, a principal different point from the first or second embodiment is arrangement of the electrodes. Therefore, descriptions of functions and the method of controlling the respective electrodes will be omitted as well.

FIG. 10A and FIG. 10B are drawings illustrating the modifications of the capacitance sensor electrode 110 of the mutual-capacitance type. FIG. 10A illustrates a modification in which the transmitting electrode 111, the first receiving electrode 112, and the second receiving electrode 113 are formed on the ellipsoidal base member 211, and the first receiving electrode 112 and the second receiving electrode 113 are arranged on both sides of the transmitting electrode 111 in a horizontal direction. In this modification, since the electrodes are arranged in the horizontal direction, installation in an area having a small space in a vertical direction such as a belt molding of the vehicle may be made. The electrode, having an ellipsoidal shape, may be installed inside an exterior surface of an emblem of the vehicle, for example, so that the capacitance sensor electrode 110 can be installed on the vehicle without impairing an appearance of the vehicle.

FIG. 10B is a modification in which the shapes of the base member 211, the transmitting electrode 111, the first receiving electrode 112, and the second receiving electrode 113 in FIG. 10A have a rectangular shape or a square shape. According to the modification, a surface area efficiency is better than the above-described ellipsoidal shape, and installation may be made in an area having further smaller space.

FIG. 11A to FIG. 11E are drawings illustrating the modifications of the capacitance sensor electrode 110 of the self-capacitance type. FIG. 11A is a modification on which the first detecting electrode 712 and the second detecting electrode 713 are arranged on the laterally elongated ellipsoidal base member 211. This modification is intended for a case where the user operates with his or her hand. In contrast to the case illustrated in FIG. 7A, more preferably, the first detecting electrode 712 is arranged on the upper side, and the second detecting electrode 713 is arranged on the lower side. As described in the first embodiment, in the case where the user operates the capacitance sensor electrode 110 with his or her hand, the accuracy of discrimination between the normal operation and the erroneous operation is improved when the first detecting electrode 712, which is the detecting electrode operated by the user, is arranged on the upper side.

FIG. 11B illustrates a modification in which a wide clearance is provided between the first detecting electrode 712 and the second detecting electrode 713. The width of the clearance is preferably larger than the width of the first detecting electrode 712, for example. Accordingly, the detecting area for detecting the user operation is further limited, and hence the accuracy of discrimination between the normal operation and the erroneous operation is improved.

FIG. 11C is a modification in which the first detecting electrode 712 and the second detecting electrode 713 illustrated in FIG. 11A are arranged in the horizontal direction. In the same manner as in FIG. 10A, installation in an area having a small space in the vertical direction is effectively facilitated.

FIG. 11D is a modification in which a clearance between the first detecting electrode 712 and the second detecting electrode 713 in FIG. 11C is widened. The width of the clearance is preferably larger than the width of the first detecting electrode 712, for example. In the same manner as in FIG. 11B, the accuracy of discrimination between the normal operation and the erroneous operation is effectively improved.

FIG. 11E is a modification in which the first detecting electrode 712 having a rectangular or square shape is provided on the rectangular base member 211, and the second detecting electrodes 713 having a rectangular or square shape are provided on both sides thereof in the horizontal direction. In this modification, the second detecting electrodes 713 functioning as electrodes for detecting erroneous detection are provided on the both sides of the first detecting electrode 712 in the horizontal direction. Accordingly, the detecting area for detecting the user operation is limited, and hence the accuracy of discrimination between the normal operation and the erroneous operation is improved.

An operation detecting apparatus for a vehicle according to an aspect of this disclosure includes: a detecting unit including a first electrode and a second electrode for detecting variations in capacitance value; a capacitance measuring unit configured to measure a first capacitance value detected by the first electrode and a second capacitance value detected by the second electrode; a determining unit configured to compare a value on the basis of an amount of variations in the first capacitance value with a value on the basis of an amount of variations in the second capacitance value and determine presence or absence of operation from a user on the basis of the result of comparison; and an output unit configured to output a control signal on the basis of a result of determination of the determining unit.

In the operation detecting apparatus for a vehicle, the determining unit may determine that operation is performed by the user in a case where an absolute value of the amount of variations in the first capacitance value is not smaller than a predetermined threshold value, and the absolute value of the amount of variations in the first capacitance value is not smaller than an absolute value of the amount of variations in the second capacitance value.

In the operation detecting apparatus for a vehicle, a detecting area of the second electrode may be larger than a detecting area of the first electrode.

In the operation detecting apparatus for a vehicle, the second electrode may have a larger surface area than the first electrode.

In the operation detecting apparatus for a vehicle, the capacitance measuring unit may include a converting unit configured to convert the first capacitance value and the second capacitance value to voltage values at a time of measuring, and an amplification rate when converting the second capacitance value into the voltage value may be larger than an amplification rate when converting the first capacitance value into the voltage value.

The operation detecting apparatus for a vehicle may further include an operating unit configured to multiply at least one of a value on the basis of the amount of variations in the first capacitance value and a value on the basis of the amount of variations in the second capacitance value by a coefficient, and multiplication of the coefficient may make the detecting area of the second electrode larger than the detecting area of the first electrode.

In the operation detecting apparatus for a vehicle, the determining unit may determine that operation is not performed by the user in the case where the absolute value of the amount of variations in the first capacitance value is smaller than a predetermined threshold value.

The operation detecting apparatus for a vehicle may further include a third electrode in addition to the first electrode and the second electrode, and the first capacitance value may be a capacitance value between the first electrode and the third electrode, and the second capacitance value may be a capacitance value between the second electrode and the third electrode.

According to the aspect of this disclosure, an operation detecting apparatus for a vehicle in which the potential to detect operation erroneously is reduced is proposed.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An operation detecting apparatus for a vehicle comprising:
    a detecting unit including a first electrode and a second electrode for detecting variations in capacitance value;
    a capacitance measuring unit configured to measure a first capacitance value detected by the first electrode and a second capacitance value detected by the second electrode;
    a determining unit configured to compare a value on the basis of an amount of variations in the first capacitance value with a value on the basis of an amount of variations in the second capacitance value and determine presence or absence of operation from a user on the basis of the result of comparison;
    an output unit configured to output a control signal on the basis of a result of determination of the determining unit; and
    an operating unit configured to multiply at least one of a value on the basis of the amount of variations in the first capacitance value and a value on the basis of the amount of variations in the second capacitance value by a coefficient, wherein
    multiplication of the coefficient makes a detecting area of the second electrode larger than a detecting area of the first electrode.

2. The operation detecting apparatus for a vehicle according to claim 1, wherein the determining unit determines that operation is performed by the user in a case where an absolute value of the amount of variations in the first capacitance value is not smaller than a predetermined threshold value, and the absolute value of the amount of variations in the first capacitance value is not smaller than an absolute value of the amount of variations in the second capacitance value.

3. The operation detecting apparatus for a vehicle according to claim 1, wherein
    the second electrode has a larger surface area than the first electrode.

4. The operation detecting apparatus for a vehicle according to claim 1, wherein
    the capacitance measuring unit includes a converting unit configured to convert the first capacitance value and the second capacitance value to voltage values at a time of measuring, and
    an amplification rate when converting the second capacitance value into the voltage value is larger than an amplification rate when converting the first capacitance value into the voltage value.

5. The operation detecting apparatus for a vehicle according to claim 1, wherein
    the determining unit determines that operation is not performed by the user in the case where the absolute value of the amount of variations in the first capacitance value is smaller than a predetermined threshold value.

6. An operation detecting apparatus for a vehicle comprising:
    a detecting unit including a first electrode and a second electrode for detecting variations in capacitance value;
    a capacitance measuring unit configured to measure a first capacitance value detected by the first electrode and a second capacitance value detected by the second electrode;
    a determining unit configured to compare a value on the basis of an amount of variations in the first capacitance value with a value on the basis of an amount of variations in the second capacitance value and determine presence or absence of operation from a user on the basis of the result of comparison;
    an output unit configured to output a control signal on the basis of a result of determination of the determining unit; and
    a third electrode in addition to the first electrode and the second electrode, wherein
    the first capacitance value is a capacitance value between the first electrode and the third electrode, and the second capacitance value is a capacitance value between the second electrode and the third electrode.

* * * * *